United States Patent [19]

Kobayashi et al.

[11] Patent Number: 4,630,241

[45] Date of Patent: Dec. 16, 1986

[54] METHOD OF PROGRAMMING FOR PROGRAMMABLE CIRCUIT IN REDUNDANCY CIRCUIT SYSTEM

[75] Inventors: Noboru Kobayashi, Yokohama; Satoshi Konishi, Tokyo, both of Japan

[73] Assignee: Tokyo Shibaura Denki Kabushiki Kaisha, Kawasaki, Japan

[21] Appl. No.: 563,504

[22] Filed: Dec. 20, 1983

[30] Foreign Application Priority Data

Dec. 28, 1982 [JP] Japan .............................. 57-227427

[51] Int. Cl.$^4$ ....................... G11C 29/00; G06F 11/00
[52] U.S. Cl. .................................... 365/200; 365/240; 371/10; 371/21
[58] Field of Search ................. 365/200, 96, 240, 201; 371/10, 21

[56] References Cited

U.S. PATENT DOCUMENTS

| | | | |
|---|---|---|---|
| 3,758,761 | 9/1973 | Henrion | 371/8 |
| 4,250,570 | 2/1981 | Tsang et al. | 365/200 |
| 4,358,833 | 11/1982 | Folmsbee et al. | 365/200 |
| 4,446,534 | 5/1984 | Smith | 365/200 |
| 4,460,998 | 7/1984 | Yamada et al. | 371/10 |
| 4,464,736 | 8/1984 | Smith | 371/10 |

OTHER PUBLICATIONS

Tolley et al, "72K RAM Stands Up to Soft and Hard Errors", *Electronics*, vol. 55, No. 12, Jun. 16, 1982, pp. 147-151.

Spaw et al, "A 128K EPROM With Redundancy", *IEEE Solid State Circuits Conference, Digest of Technical Papers*, Feb. 1982, pp. 112-113, 304.

*IEEE International Solid-State Circuits Conference*, 1981, pp. 80-81, "Memories and Redundancy Techniques", K. Kokkonen et al.

*Primary Examiner*—Stuart N. Hecker
*Assistant Examiner*—Glenn A. Gossage
*Attorney, Agent, or Firm*—Oblon, Fisher, Spivak, McClelland, & Maier

[57] ABSTRACT

A method of programming for a programmable circuit in a redundancy circuit system including a RAM having normal and spare memory cell rows constructed on a common chip and the programmable circuit, is disclosed. The programmable circuit has a plurality of fuses and can produce a signal for disabling all the normal memory cell rows while enabling a spare memory cell row corresponding to a combination of blown-out fuses and non-blown-out ones among the plurality of fuses with respect to a certain normal memory cell row address. The method comprises the steps of detecting a faulty memory cell row, storing the address thereof and supplying a fuse-blowing current one after another of those of the programmable circuit fuses which correspond to a certain logic level bits of the stored address.

4 Claims, 13 Drawing Figures

METHOD OF PROGRAMMING FOR PROGRAMMABLE CIRCUIT IN REDUNDANCY CIRCUIT SYSTEM

BACKGROUND OF THE INVENTION

1. Field of the Invention

This invention relates to a method of programming for a programmable circuit in a redundancy circuit system and an apparatus for carrying out the method.

2. Discussion of Summary

Redundancy circuit systems, which have a plurality of normal subsystems connected to each other to form a certain circuit system and additional spare subsystems, the normal and spare subsystems having identical functions, and in which those of the normal subsystems which do not function as expected are replaced by spare subsystems, are well known in the art. Such redundancy circuit systems are frequently used for semiconductor memories and especially for large scale integrated circuits in order to improve the yield. With increase of the integration density, the probability of presence of a faulty subsystem in a circuit system is increased, and a system which has even a single faulty subsystem is rejected as a faulty system.

In an elementary redundancy circuit system that has been proposed, a plurality of normal subsystems and the same number of spare subsystems are provided and adapted to be connected to the following subsystems by programmable selectors. The selectors have fuses formed of, for example, a polysilicon layer as programmable elements, which are selectively blown out depending on whether the corresponding normal subsystems are faulty or not. Either normal or spare subsystems is used to form a circuit system depending on whether the pertinent fuse is remained as formed or blown out. According to this concept, the redundancy is too high, that is, it is highly liable that many spare subsystems ultimately are not used. This is undesired from the standpoint of the inegration density. In addition, since each selector requires a fuse, a large number of fuses must be used for the entire system. This may reduce the reliability of the system.

As another type of redundancy circuit system, there is one, in which spare subsystems are provided in number smaller than the number of normal subsystems.

An example of such system is disclosed in the U.S. Pat. No. 3,758,761 (Henrion) issued on Sept. 11, 1973. FIG. 1 schematically shows the disclosed redundancy circuit system. The system comprises n normal subsystems $10_1$ to $10_n$, m spare subsystems $12_1$ to $12_m$ and programmable selectors $14_1$ to $14_{n+m}$ connected between an input terminal (here, an I/O line) and the respective subsystems $10_1$ to $10_n$ and $12_1$ to $12_m$. When the individual subsystems $10_1$ to $10_n$ and $12_1$ to $12_m$ are selected by the programmable selectors $14_1$ to $14_{n+m}$, they are enabled and connected to a next stage subsystem 16.

The programmable selectors $14_1$ to $14_{n+m}$ include respective counters whose counts designate the numbers of the subsystems for which the selectros are used. They also each include a polysilicon fuse. A selector with the fuse thereof not blown out, is in an enabled state. That is, it can connect the corresponding subsystem to the next stage subsystem when a signal specifying the selector is input to the I/O line. A selector with its fuse blown out, on the other hand, is in a disabled state and will never connect the corresponding subsystem to the next stage when the signal specifying the selector is input to the I/O line. At this time, a counter which is included in the selector, is not started to count up. Instead, the next selector is enabled in place of it. The following selectors are likewise used in place of their immediately preceding selectors.

For example, when a j-th (j<n) selector $14_j$ has its fuse not blown out, it will select the corresponding j-th normal subsystem $10_j$. At this time, the selector $14_j$ supplies the counter in the next selector $14_{j+1}$ with a signal indicative of the fact that the next selector $14_{j+1}$ is entitled to select the (j+1)-th normal subsystem $10_{j+1}$. In the event when the j-th normal subsystem $10_j$ is faulty, the fuse in the selector $14_j$ is blown out, that is, the selector $14_j$ is disabled. Thus, the faulty normal subsystem $10_j$ is never connected to the next stage subsystem 16. At this time, the counter in the selector $14_j$ does not count up. Consequently, the selector $14_{j+1}$ is supplied with a signal from the selector $14_{j-1}$, i.e., a signal indicative of the fact that it is for the j-th normal subsystem. The selector $14_{j+1}$ thus acts as the j-th selector.

As has been shown, with this system the presence of a faulty normal subsystem will cause an advance of the subsequent subsystems by one place and, in the worst case where there are m faulty normal subsystems, the m-th spare subsystem $12_m$ acts as the n-th normal subsystem $10_n$. With this arrangement, although the spare subsystems can be reduced in number, the construction of the programmable selector is complicated. Besides, with one fuse necessary for each selector, the entire system requires about n+m fuse, more correctly n+m−1 fuses because no fuse is necessary for the last selector $14_{n+m}$. Therefore, the number of necessary fuses is increased with increasing number of normal subsystem, which is undesired from the standpoint of the reliability.

A further system, which is intended to reduce the number of fuses used, is disclosed in "Memories and Redundancy Techniques", by Kim Kokkonen et al, ISSCC '81, WPM 8.1. FIG. 2 schematically shows this system. The system is shown comprising n normal subsystems $20_1$ to $20_n$ and m spare subsystems $22_1$ to $22_m$, these subsystems being adapted for selective connection to a next stage subsystem 24. Selectors $26_1$ to $26_n$ (which are not programmable) are connected between the respective normal subsystems $20_1$ to $20_n$ and an I/O line, and programmable selectors $28_1$ to $28_m$ are connected between the respective spare subsystems $22_1$ to $22_m$ and the I/O line. The outputs of the programmable selectors $28_1$ to $28_m$ through an OR gate 30 to an inhibit terminal of each of the selectors $26_1$ to $26_n$.

In this redundancy circuit system, if the normal subsystems $20_1$ to $20_n$ are all good, the programmable selectors $28_1$ to $28_m$ are not programmed at all, but are all in the disabled state so that none of the spare subsystems $28_1$ to $28_m$ will be selected. In this case, the normal subsystems $20_1$ to $20_n$ are selected by the selectors $26_1$ to $26_n$. If the j-th normal subsystem $20_j$ is faulty, the programmable selector $28_1$ is programmed with its fuses blown out so that the programmable selector $28_1$ is enabled and the spare subsystem $22_1$ is selected when a select signal for selecting the faulty j-th normal subsystem $20_j$ is input to the I/O line. The signal for selecting the spare subsystem $22_1$ is also fed through the OR gate 30 to all the selectors $26_1$ to $26_n$ to disable these selectors $26_1$ to $26_n$.

As is shown, this system requires programmable selectors in number corresponding to only the number of spare subsystems. In the individual programmable selectros, the address designating which normal subsystem is faulty is stored. If these addresses are to be stored as binary data, it can be done with only $\log_2 n$ fuses. Actually, each programmable selector requires a further fuse for determining whether or not to use the spare subsystems, that is, the system as a whole requires $m \times (1+\log_2 n)$ fuses. In other words, in this embodiment the number of necessary fuses need not be increased in proportion to the number of normal and spare subsystems, which is desirable from the standpoint of the reliability. As an example, suppose a RAM of 64 K bits, in which each subsystem is a memory cell row consisting of 256 memory cells, and which has three spare memory cell rows. In this case $256+3-1=258$ fuses are necessary according to the aforementioned patent, whereas with this system requires only $3 \times (1+\log_2 256)=27$ fuses. However, according to the aforementioned patent only a single fuse is blown out when one of spare subsystems is enabled, whereas with this system the number of fuses that are blown out when one of spare subsystems is eanbled is between 1 and $1+\log_2 256=9$. The blowing of a fuse may be done by irradiation of laser beam from outside the chip or by externally causing current through a wire bonding pad provided on one terminal end of the fuse, but usually a fuse-blowing circuit is composed on the chip. The fuse-blowing circuit supplies a large current of a constant level. Therefore, if the several fuses are simultaneously blown out for programming an address of a faulty subsystem and the number of fuses is large, the current flowed through each fuse is liable to be too small to ensure reliable blowing of the fuse. To solve this problem, the fuse-blowing circuit may be designed such that it always blows out the maximum possible number of fuses. Doing so, however, would be required large dimension of current path leads and control switching elements, which are not suitable for high density integration.

SUMMARY OF THE INVENTION

An object of the invention is to provide a method and apparatus for programming a programmable circuit in the last-mentioned type of redundancy circuit system in which a spare subsystem is substituted for a faulty normal subsystem according to a combination of blown-out fuses and non-blown-out ones as programmable elements, which can ensure reliable blowing of fuses without increasing the size of the redundancy circuit system and reducing the integration density thereof.

The object of the invention is attained by a method of programming for a programmable circuit in a redundancy circuit system having a plurality of normal subsystems to form a circuit system and spare subsystems, said programmable circuit having a plurality of fuse elements, as programmable elements, capable of being selectively blown out to substitute a spare subsystem for a faulty normal subsystem, said method comprising the steps of:

specifying a faulty normal subsystem to be substituted for by a spare subsystem;

determining a combination of blown-out and non-blown-out ones of said fuse elements corresponding to said specified faulty normal sybsystem;

dividing the fuse elements into at least two groups; and passing a fuse-blowing current through each group of fuse elements according to the combination.

DETAILED DESCRIPTION OF THE PREFERRED EMBODIMENTS

Figure 1:
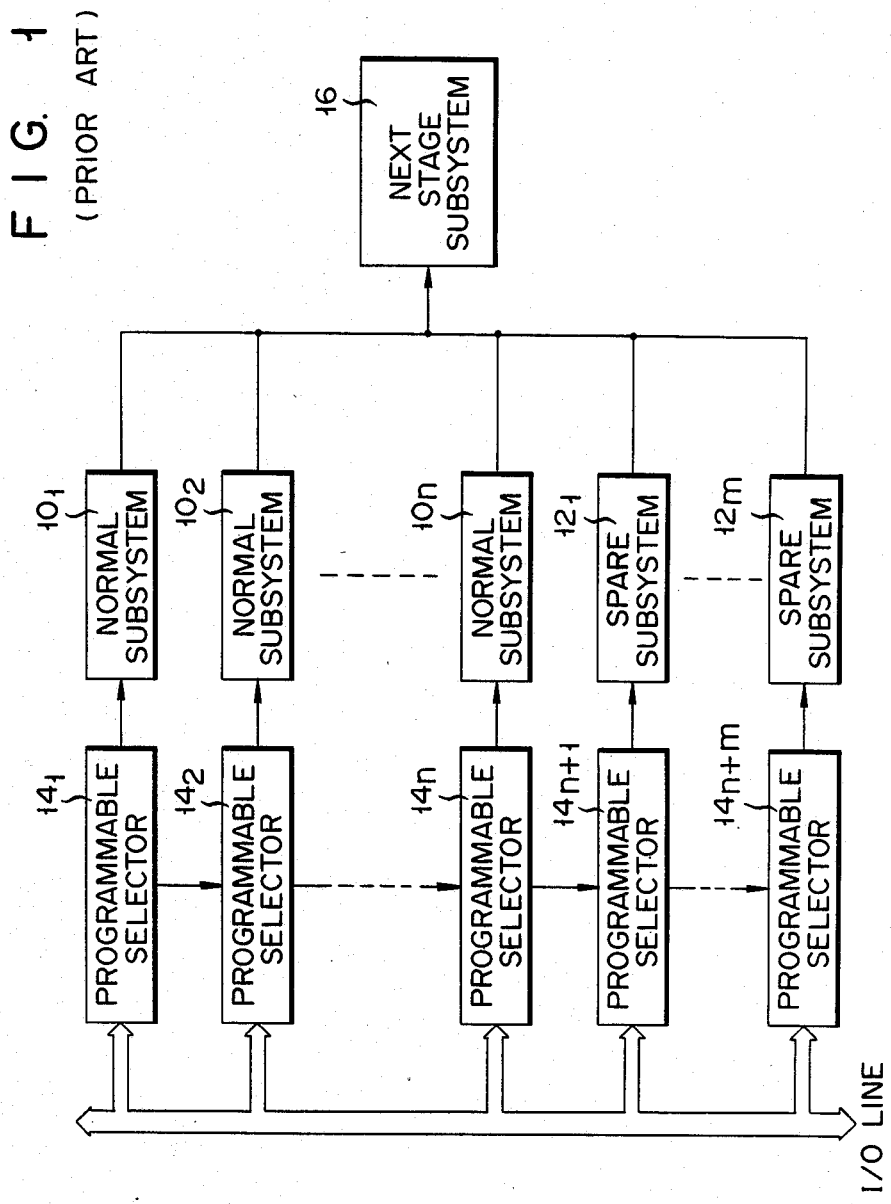
FIGS. 1 and 2 are block diagrams showing respective prior art programmable circuits in redundancy circuit system.
Figure 2:
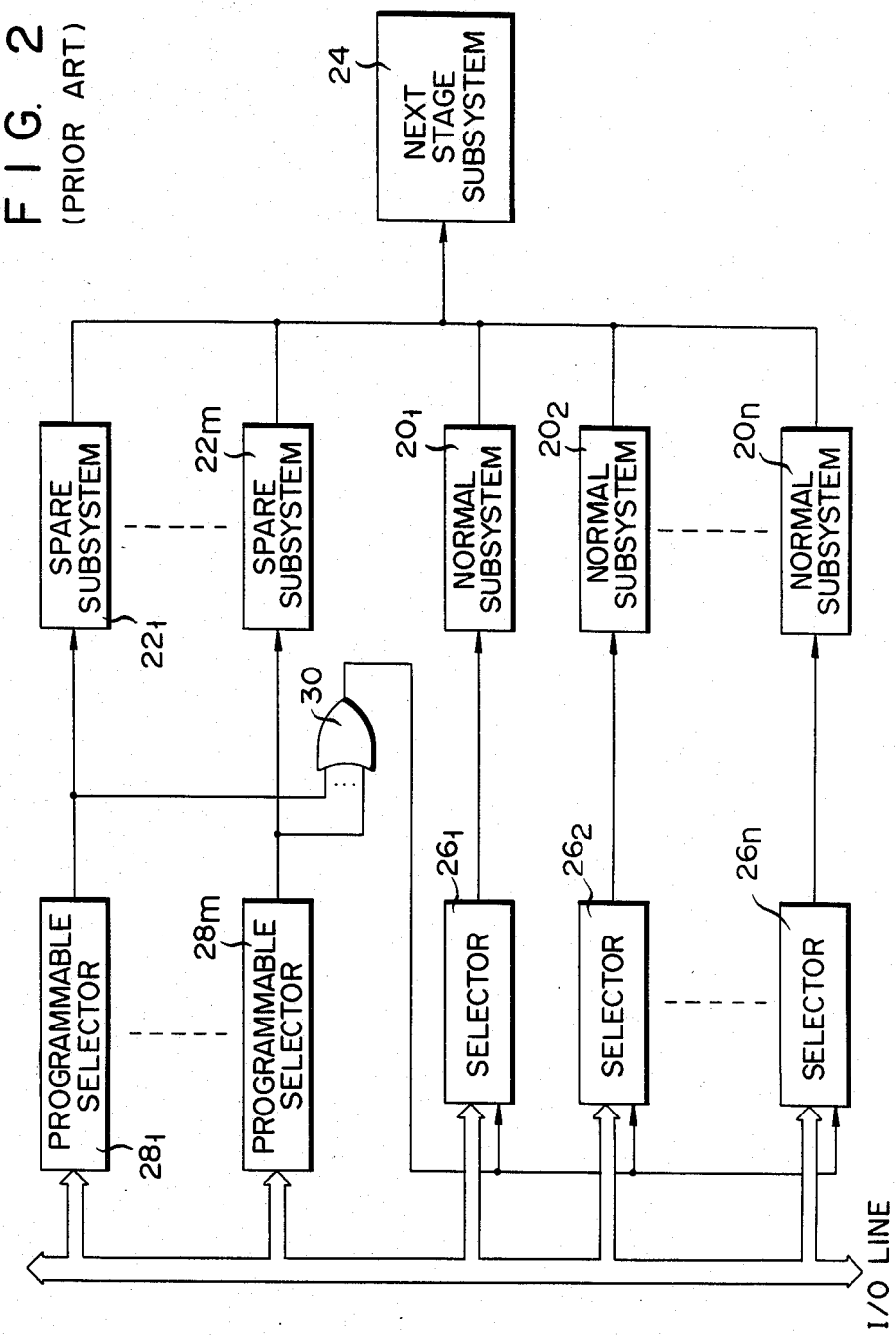
Figure 3:
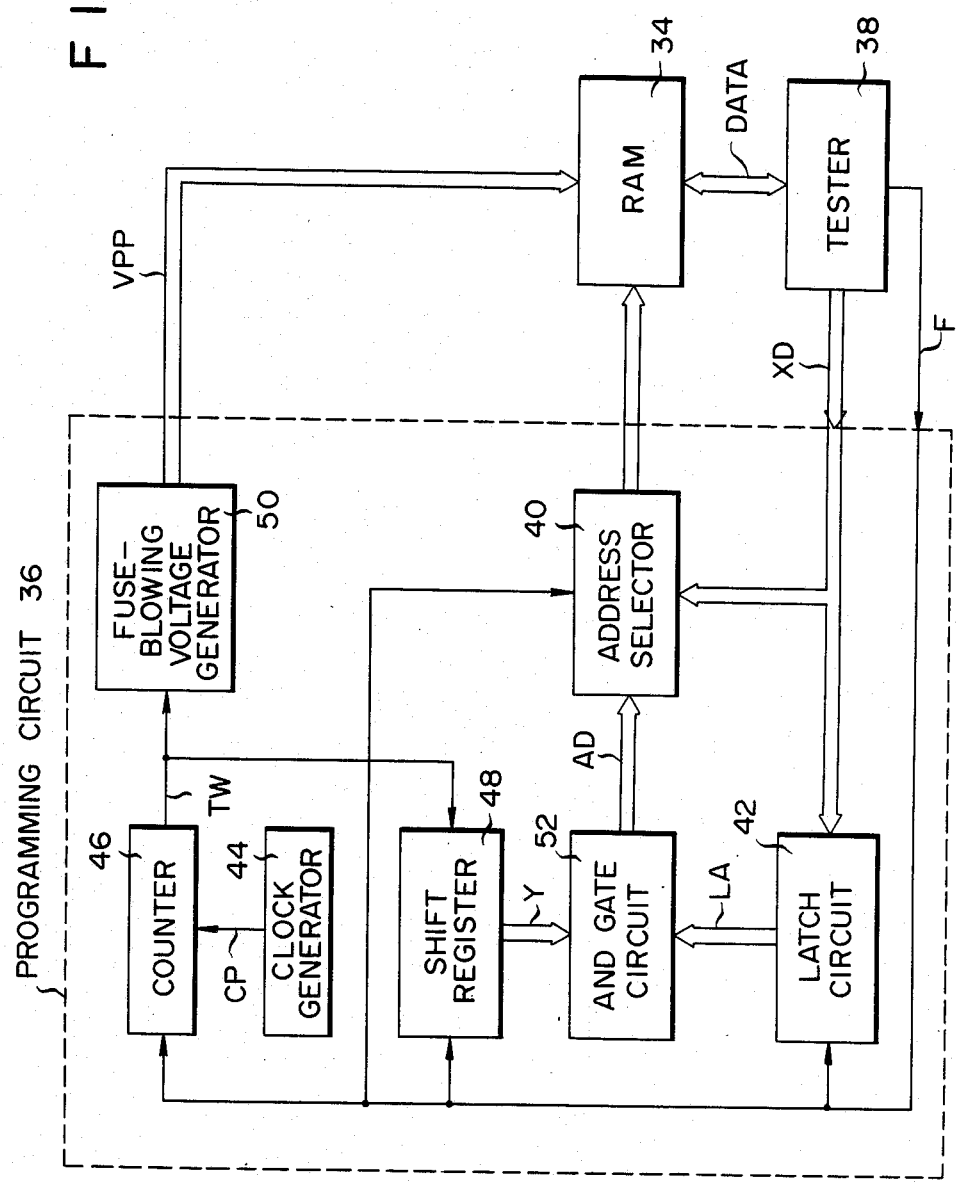
FIG. 3 is a schematic representation of an embodiment of the apparatus for programming according to the invention along with a RAM as a reduandancy circuit system.

Preferred embodiments of the method and apparatus for programming according to the invention will now be described with reference to the accompanying drawings. FIG. 3 shows a block diagram of an embodiment of the programming apparatus along with RAM as redundancy circuit system. The RAM 34 has normal memory cells constituting normal subsystems and spare memory cells constituting spare subsystems, these memory cells being formed on the same chip. The RAM 34 also has programmable circuits, which can be programmed (written) address data of faulty normal memory cells for substituting spare memory cells for the faulty normal memory cells. The details of the RAM 34 will be described hereinunder.

A programming circuit 36 for programming the programmable circuits, is connected to the RAM 34 and also to a tester 38 which tests the normal memory cells of the RAM. The tester 38 tests the RAM 34 when the fablication of the RAM has been completed up to a predetermined stage previous to die-sort process, at which data can be written into and read out from the RAM. The test is done to check whether the individual normal memory cells are faulty or not by writing known data into the cells and checking the identity of readout out data from the same cells with those supplied for writing. The faulty memory cells may be substituted for collectively after the completion of checking of all the normal memory cells. In this embodiment, however, the tester 38 generates a flag signal F every time it detects a faulty normal memory cell, and a programming operation is started by the flag F.

The tester 38 produces a read/write address signal XD for the checking. The address signal XD is supplied to an address selector 40 and also to a latch circuit 42. The address selector 40 supplies either a first or second input address signal XD or AD as an address signal to the RAM 34 depending on whether there is a flag signal F or not. The latch circuit 42 latches the address signal XD in synchronism to the rising of flag signal F. This means, herein, that the address signal XD is an address signal of a faulty memory cell. A clock generator 44 generates clock pulses CP which serve to provide a reference timing, with respect to which the programming operation is performed. A binary counter 46 receives the clock pulses CP and the frequency of the clock pulses is divided into one half. An output pulse TW of the counter 46 is supplied to a serial input terminal of a shift register 48, which functions as a serial-to-parallel converter. The counter output TW is also supplied to a fuse-blowing voltage generator 50. The counter 46 and shift register 48 also receive the flag signal F, and they start their operation in response to the rising of the flag signal F. The shift register 48 issues logic "1" signals one by one from each of its successive bit output terminals, i.e., one logic "1" signal from an output terminal and the next one from the next output terminal, with respect to every time when one short pulse signal is supplied. The number of bits of the shift register 48 is equal to the number of bits of the address signal XD of the RAM 34. The output LA of the latch circuit 42 and the output Y of the shift register 48 are supplied to an AND gate circuit 52. The AND gate circuit 52 logically multiplies the outputs LA and Y of the latch circuit 42 and shift register 48 for each bit. Since the shift register 48 provides a logic "1" signal one by one from each of its successive bits, the AND gate circuit 52 passes the output signal LA of the latch circuit 42 for a bit after another. The output signal, i.e., the second input address signal, AD of the AND gate circuit 52 is supplied to the address selector 40. The fuse-blowing voltage generator 50 provides an output VPP which is supplied to a fuse-blowing voltage terminal of the RAM 34 which will be described later in detail.

Figure 4:
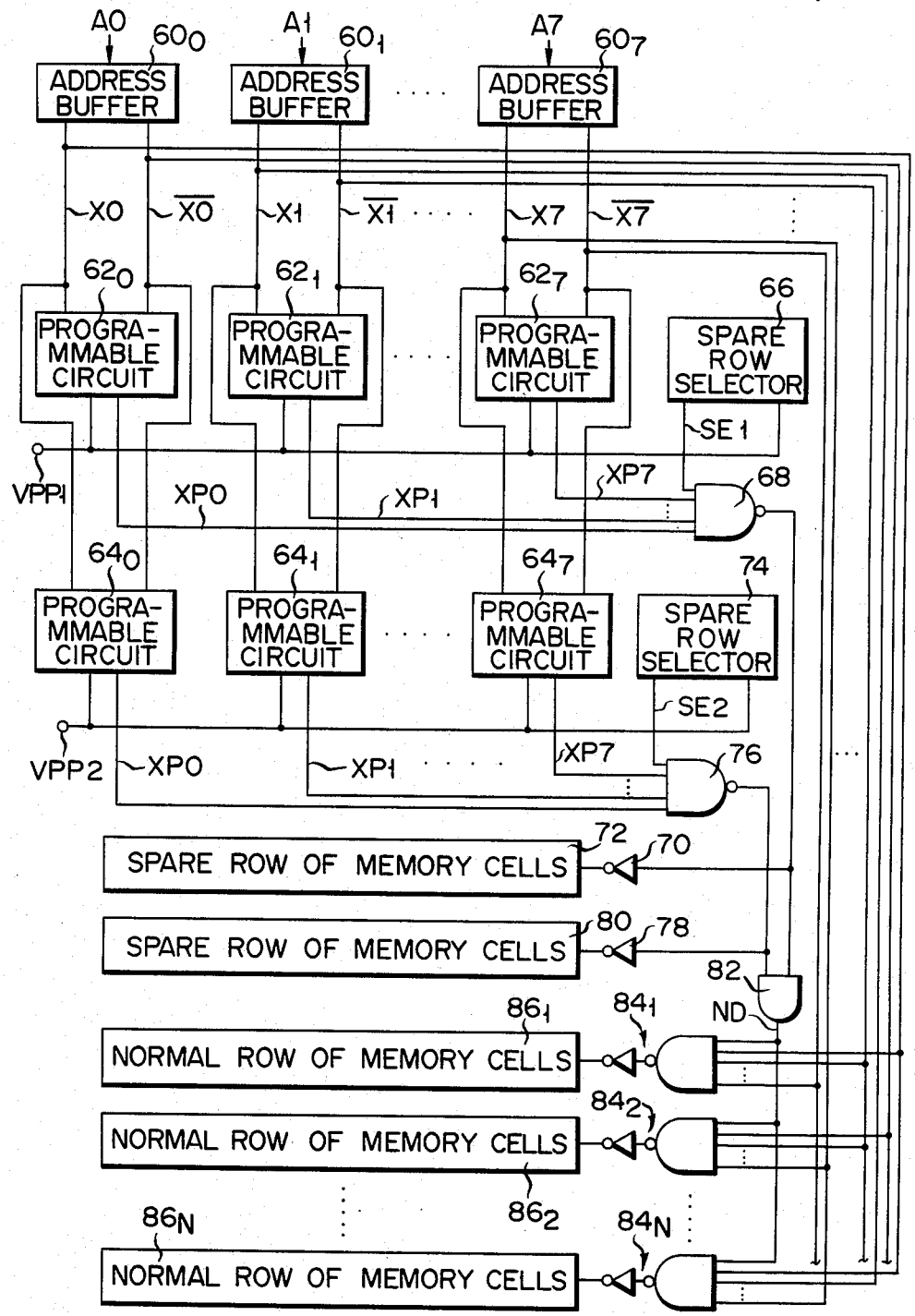
FIG. 4 is a circuit diagram of the RAM shown in FIG. 3.

FIG. 4 shows the detailed circuit construction of the RAM 34. Where the RAM 34 is constructed such that each normal memory cell is independently capable of substitution, the circuit for the substitution is complicated in construction. Accordingly, in the present embodiment the substitution is done as a certain unit of memory cells (memory cell row). More specifically, a normal memory cell row which includes even a single faulty memory cell is substituted for by a spare memory cell row. Of course, the same scheme can be applied to memory cell columns as well. In FIG. 4, however, only two spare memory cell rows are shown, and the illustration of the circuitry dealing with column address, such as column decoders, etc. is omitted for simplicity.

In this embodiment, a row address signal consists of a 8-bit data. The individual bit data $A_0, A_1, \ldots, A_7$ of the row address signal are supplied to respective address buffers $60_0, 60_1, \ldots, 60_7$. The address buffer $60_i$ (i=0 to 7) produces a same logic signal Xi having the same logic level as that of the row address signal Ai and an inverted logic signal $\overline{X_i}$ having the inverted logic level of that of the row address signal Ai. The same and inverted logic signals Xi and $\overline{X_i}$ are supplied to programmable circuits $62_i$ and $64_i$ for selecting the first and second spare memory cell rows, respectively. The programmable circuits $62_i$ and $64_i$ provide either input data Xi or $\overline{X_i}$ as program output data XPi according to a program content (the states of fuses such as being blown-out or non-blown-out). The output XP0 to XP7 of the programmable circuits $62_0$ to $62_7$ for the first spare memory cell row and the output of a spare row selector 66 for the first spare memory cell row, i.e., a first spare row enable signal SE1, are supplied to a NAND gate 68. The output of the NAND gate 68 is supplied through an inverter 70 to a word line of the first spare memory cell row 72. The NAND gate 68 and an inverter 70 constitute a row decoder for the first spare row. The outputs XP0 to XP7 of the programmable circuits $64_0$ to $64_7$ for the second spare memory cell row and the output of a spare row selector 74 for the second spare memory cell row, i.e., a second spare row enable signal SE2, are supplied to a NAND gate 76. The output of the NAND gate 76 is supplied through an inverter 78 to a word line of the second spare memory cell row 80. The output voltage VPP of the fuse-blowing voltage generator 50 is selectively applied to fuse-blowing voltage terminals VPP1 and VPP2. The terminal VPP1 is connected to the programmable circuits $62_0$ to $62_7$ and spare row selector 66 for the first spare row, while the terminal VPP2 is connected to the programmable circuits $64_0$ to $64_7$ and spare row selector 74 for the second spare memory cell row.

The outputs of the NAND gates 68 and 76 are also supplied to an AND gate 82 which provides a normal row disable signal ND. The signal ND is supplied to the word lines of individual normal memory cell rows $86_1$ to $86_N$ through respective row decoders $84_1$ to $84_N$.

Figure 5:
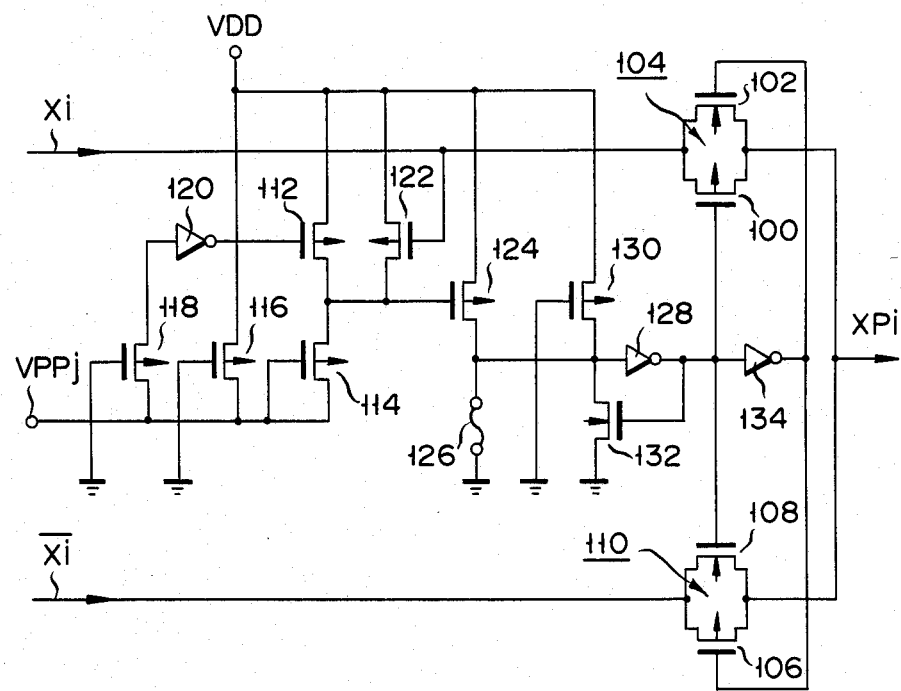
FIG. 5 is a circuit diagram showing a programmable circuit in the RAM of FIG. 4.

FIG. 5 shows the circuit construction of the programmable circuits $62_i$ and $64_i$. The same logic signal Xi is supplied to each one terminal of p- and n-channel MOS FETs 100 and 102, respectively. The MOS FETs 100 and 102 have their other terminals connected to each other, and they constitute a CMOS transfer gate 104. The inverted logic signal $\overline{X_i}$ is supplied to each one terminal of p- and n-channel MOS FETs 106 and 108, respectively, which have their other terminals connected to each other and constitute a CMOS transfer gate 110. The output XPi of the programmable circuit $62_i$ or $64_i$ is produced from a common connection point of the other terminals of the CMOS transfer gates 104 and 110. P-channel MOS FETs 112 and 114 are connected in series between a power supply voltage terminal VDD and the fuse-blowing voltage terminal VPPj (j=1 or 2). The gate of the MOS FET 114 is connected to the terminal VPPj. A p-channel MOS FET 116 is connected between the terminals VDD and VPPj. Its gate is grounded. The terminal VPPj is connected through a gate-ground p-channel MOS FET 118 and an inverter 120 in series to the gate of the MOS FET 112. A p-channel MOS FET 122 is connected between the connection point between the MOS FETs 112 and 114 and the terminal VDD. The same address signal Xi is supplied to its gate. A p-channel MOS FET 124 and a polysilicon fuse 126 as programmable element are connected in series between the terminal VDD and the ground. The conjunction point of the MOS FETs 112 and 114 is connected to the gate of the MOS FET 124. The conjunction point of the MOS FET 124 and fuse 126 is connected through an inverter 128 to the gates of the p- and n-channel MOS FETs 100 and 108. A p- and n-channel MOS FET 130 and 132 are connected in series between the terminal VDD and the ground. The conjunction point between the MOS FETs 130 and 132 is connected to the input terminal of the inverter 128. The gate of the MOS FET 132 is connected to the output terminal of the inverter 128. The output terminal of the inverter 128 is connected through an inverter 134 to the gates of the n- and p-channel MOS FETs 102 and 106.

Figure 6:
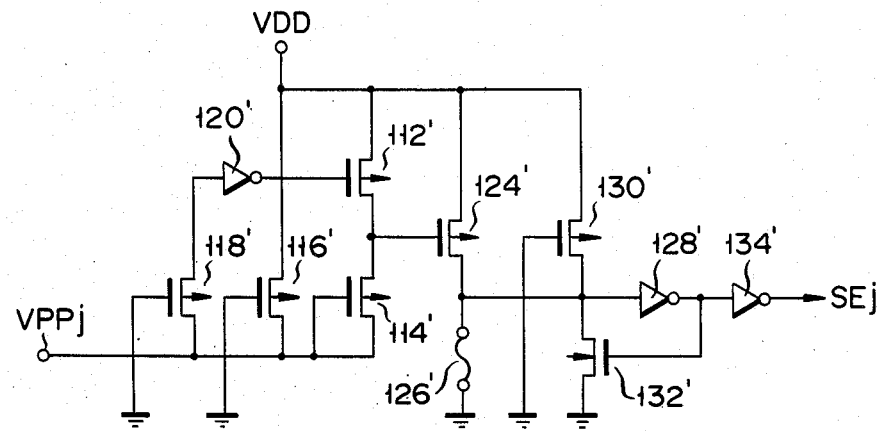
FIG. 6.is a circuit diagram showing a spare row selector in the RAM of FIG. 4.

FIG. 6 shows the detailed circuit construction of the spare row selectors 66 and 74 shown in FIG. 4. This circuit is similar to that of the programmable circuits $62i$ and $64i$ but its elements relative to the address signal, i.e., CMOS transfer gates 104 and 110 and p-channel MOS FET 122 connecting the terminal VDD to the gate of the fuse-blowing control p-channel MOS FET 124, are excluded from the circuit shown in FIG. 5.

The operation of method of programming for the programmable circuits in the redundancy circuit system according to the first embodiment will be described. The basic principle will first be described.

The individual bit data A0 to A7 of row address signal are fed to the respective address buffers $60_1$ to $60_7$, which produce the same and inverted logic signals X0 to X7 and $\overline{X0}$ to $\overline{X7}$. The signals X0 to X7 and $\overline{X0}$ to $\overline{X7}$ are selectively supplied to the row decoders $84_1$ to $84_N$, one of which is selected according to the row address signals Xi and $\overline{Xi}$. Only the inverter of the selected decoder produces logic "1" signal, and the other decoders produce logic "0" signal. Where no redundancy is used, that is, no spare row is used, the outputs SE1 and SE2 of the spare row selectros 66 and 74 are set to logic level "0" so that the logical level of the outputs of the NAND gates 68 and 76 are always "1" and the logic level of the outputs of the inverters 70 and 78 in the spare row decoders are always "0". By so doing, the logic level of the output ND of the AND gate 82 is always "1", so that the row decoders $84_1$ to $84_N$ will always normally operate according only to the address signal Xi and $\overline{Xi}$. On the other hand, where redundancy is used, that is, a spare row is used, the programmable circuits and spare row selectors for one spare row are programmed, that is, their fuses are selectively blown out, such that the outputs XP0 to XP7 of the programmable circuits $62_0$ to $62_7$ for one spare row and also the output SEj of the corresponding spare row selector 66 will all be of logic level "1" for row address data Xi and $\overline{Xi}$ of a specific normal memory cell row (which includes a faulty memory cell). Consequently, the NAND gate 68 provides output of logic level "0", so that the spare memory cell row 72 is selected through the inverter 70. Since at this time the logic level of the disable signal ND for the normal memory cell row is "0", the logic levels of the outputs of the normal row decoders $84_1$ to $84_N$ are "0", thus disabling all the normal rows. When programming is done with respect to a faulty row as described above, the outputs of the programmable circuits $62_0$ to $62_7$ include at least one logic level "0" for any other address signal than that of the faulty normal row, so that there is no possibility for a spare row to be selected for any other normal row.

The operation of blowing out fuse and the relation between the state of fuse and output signal in the circuits shown in FIGS. 5 and 6 will be described as follows.

To blow out the fuse 126 in the circuit of FIG. 5, the logic levels of the signals Xi and $\overline{Xi}$ are respectively set to "1" and "0" ($\overline{Xi}$ is automatically set to "0" when Xi is set to "1" because of the inverted logic relation between them). As a result, the MOS FET 122 is turned off, so that the gate of the MOS FET 124 is controlled by the MOS FETs 112 and 114. The fuse-blowing voltage VPP is a large negative voltage. Since it need only be negative with respect to the ground voltage of the individual MOS FETs, it may be positive if the MOS FETs ground voltage is highly positive. In the absence of the fuse-blowing voltage VPP, the drains of the MOS FETs 114, 116 and 118 are set to the VDD voltage through the source-drain current path of MOS FET 116. In the application of the fuse-blowing voltage VPP, the drains of the MOS FETs 114, 116 and 118 are set to the VPP voltage. As a result, the input terminal of the inverter 120 is brought to a logic level "0", which is relatively positive voltage with respect to the ground voltage by an amount corresponding to the threshold voltage of the MOS FET 118. The MOS FET 112 is thus turned off. A negative voltage, which is relatively positive with respect to the fuse-blowing voltage VPP by an amount corresponding to the threshold voltage of the MOS FET 114, is applied to the gate of the MOS FET 124. This has an effect of increasing the conductance of the MOS FET 124, so that a large current flows from the power supply terminal VDD into the fuse 126. The fuse 126 is blown out by the heat generated at this time.

For the case where the fuse 126 is not to be blown out, the logic levels of the signals Xi and $\overline{i}$ are respectively set to "0" and "1". As a result, the MOS FET 122 is turned on to pull up the gate voltage of the MOS FET 124 to the VDD level. Now, the gate voltage of the MOS FET 124 will not be lowered from the VDD level so much even with the application of the fuse-blowing voltage VPP so long as the conductance of the MOS FET 122 is set to be larger than the conductance of the MOS FET 114. The MOS FET 124 thus will not be turned on or, even it may be turned on, its conductance is too small to be able to cause enough current to blow out the fuse 126.

With the fuse 126 blown out, the input terminal of the inverter 128 is held at the VDD voltage by the MOS FET 130. The inverter 128 produces an output of logic level "0", so that the MOS FET 132 is turned off. Thus, the CMOS transfer gate 104 consisting of the p- and n-channel MOS FETs 100 and 102 is "on", while the other CMOS transfer gate 110 is "off". The signal Xi is thus transferred as the program output XPi of the programmable circuit $62i$ or $64i$. When the fuse 126 is not blown out, the input terminal of the inverter 128 is held at low voltage level near the ground voltage by the fuse 126. Thus, the MOS FET 132 is turned on by the high voltage output of the inverter 128, and the input signal to the inverter 128 is latched. Therefore, the inverter 128 produces an output of logic level "1" to have the CMOS transfer gates 104 and 110 respectively "off" and "on". The signal $\overline{Xi}$ is thus transferred as the program output XPi of the programmable circuit $62i$ or $64i$.

In the spare row selector 66 or 74 shown in FIG. 6, the fuse 126′ is blown out or not regardless of the logic levels of the address signals Xi and $\overline{Xi}$ but depending on whether the fuse-blowing voltage VPP is applied or not. When the fuse-blowing voltage VPP is applied, the inverter 120′ produces an output of logic "1" level to turn off the MOS FET 112′. Thus, a negative voltage, which is relatively positive with respect to the fuse-blowing voltage VPP by an amount corresponding to the threshold voltage of the MOS FET 114′, is applied to the gate of the MOS FET 124′ through the MOS FET 114′. The conductance of the MOS FET 124′ is thus increased to flow a large fuse-blowing current through and blow out the fuse 126′. When the fuse-blowing voltage VPP is not applied, the drains of the MOS FETs 118′, 116′ and 114′ are held at the VDD voltage by the MOS FET 116′. The input to the inverter 120' thus goes to logic level "1" to turn on the MOS FET 112'. The gate of the MOS FET 124' is thus held at the VDD voltage, so that the fuse 126' is not blown out because of turning off of the MOS FET 112'.

With the fuse 126' blown out, the input of the inverter 128' goes to logic level "1" by the MOS FET 130', and the spare row enable signal SEj (j=1 or 2) also goes to logic level "1". Without the fuse 126' blown out, the input of the inverter 128' remains logic level "0" by the fuse 126', and the spare row enable signal SEj is logic level "0".

Figure 7:
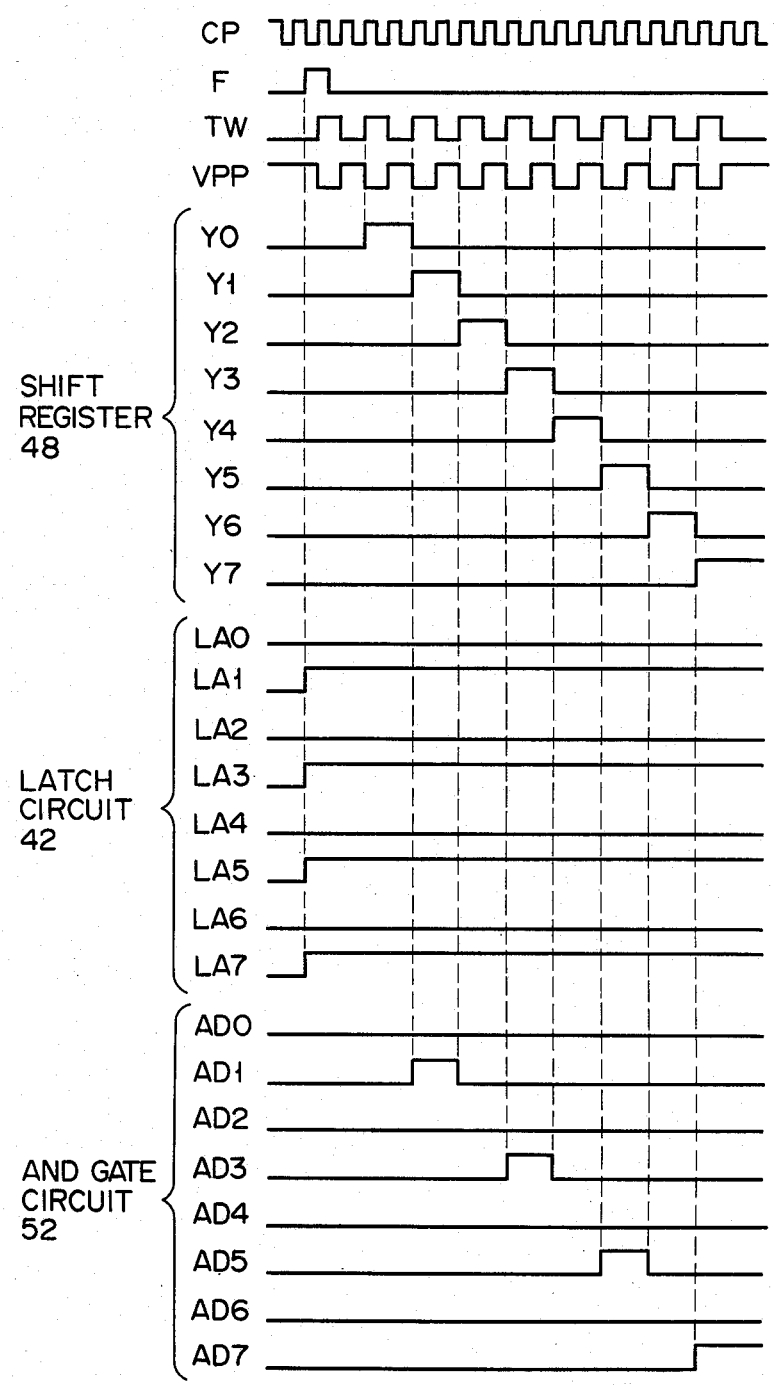
FIG. 7 is a timing chart for explaining the operation of the first embodiment.

The method of programming by the programming circuit 36 shown in FIG. 3 will now be described with reference to the timing chart of FIG. 7. When the fabrication of the RAM 34 up to the stage noted before has been ended, it is connected to the programming circuit 36 and tester 38 as shown in FIG. 3. The test is started with the generation of write address XD and test data from the tester 38. At this time, no flag signal F has yet been generated, and the address selector 40 selects the first input address signal XD. The test data is written into the RAM 34 according to this write address signal XD. Subsequently, the RAM 34 is set in a read mode, and the data noted above is read out from each memory cell of the RAM 34. Each memory cell is checked for its soundness by comparing the readout data with the written data. If the data read out from a memory cell is not identical with the written data, the memory cell is decided to be faulty. When a faulty memory cell is detected during the reading of data from the RAM 34, the tester 38 generates a flag signal (a pulse signal) F as shown in FIG. 7. At this time, the test is interrupted and the programming operation of the programming circuit 36 is started.

In response to the rising of the flag signal F, the counter 46 starts to frequency-divide clock signals CP into one half where signal TW is generated. The fuse-blowing voltage VPP is usually at a negative voltage, which is shown as of logic level "0" in FIG. 7. In other words, the fuse-blowing voltage generator 50 produces a negative pulse VPP during the period, during which the signal TW is of logic level "1". The pulse VPP is applied to either terminal VPP1 or VPP2; in the instant case it is applied to the terminal VPP1. After the present programming, i.e., for the next programming operation, it is applied to the other terminal, i.e., the terminal VPP2. It is a feature of the invention that during the programming period the fuse-blowing voltage VPP is applied not continuously but intermittently, i.e., as pulses, to the programmable circuits. The counter 46 is not operated indefinitely after it has been started by the flag signal F, it is stopped when it has produced frequency divided pulses TW in number corresponding to the number of bits of the row address plus one, the number of row address bits being 8 in the case of FIG. 7 so that the number of TW pulses is nine.

In response to the rising of the flag signal F, the shift register 48, which is an 8-bit register, provides bit output signals Y0 to Y7 as shown in FIG. 7 from respective output terminals. The latch circuit 42 latches the row address signal XD of the faulty memory cell row issued from the tester 38 in synchronism to the rising of the flag signal F. This row address signal XD is assumed to be, for example, logic level "01010101", and in this case the latch circuit 42 provides bit outputs LA0 to LA7 as shown in FIG. 7. The AND gate circuit 52 logically multiplies the outputs of the shift register 48 and latch circuit 42 and provides the individual bit as AND outputs AD0 to AD7. The output of the latch circuit 42 remains fixed after being latched, but the output of the shift register, i.e., logic level "1" output thereof, is shifted bit by bit for every pulse TW. The outputs AD0 to AD7 of the AND gate circuit 52 for the individual bits are thus produced in synchronism to the corresponding output bits of the shift register 48. They are fed through the address selector 40 as the row address data A0 to A7 to the RAM 34. With respect to a certain timing, therefore, the address data A0 to A7 are thus either all logic level "0" or logic level "1" for only one bit and logic level "0" for the other bits.

The blowing of fuse with respect to each of the timings of the nine frequency divided pulses TW will now be described. During the period of the first pulse TW, the address data A0 to A7 are all logic level "0", so that none of the fuses in the programmable circuits $62_0$ to $62_7$ is blown out even with the application of the fuse-blowing voltage pulse VPP to the terminal VPP1 of the RAM 34. The fuse in the first spare memory cell row selector 66, however, is only blown out by the application of the pulse VPP regardless of the row address. The output SE1 is thus set to logic level "1". For the period of the second pulse TW, the bit output Y0 of the shift register 48 is logic "1" level and the other bit outputs Y1 to Y7 are logic level "0", but the corresponding bit output LA0 of the latch circuit 42 is logic level "0". Thus, the outputs AD0 to AD7, i.e., A0 to A7 are all logic level "0". This situation is the same as for the period of the first pulse TW, so that none of the fuses in the programmable circuits $62_0$ to $62_7$ is blown out. For the period of the third pulse TW, the outputs Y1 and LA1 are logic level "1". Thus, of the address data AD0 to AD7 only the bit AD1 is logic level "1" and the other bits are all logic level "0". The bit data A1 is, therefore, logic level "1" and the signal X1 is logic level "1". In this situation, the fuse in the programmable circuit $62_1$ is blown out with the application of the pulse VPP. In general, the fuse in a programmable circuit $62_i$ is blown out with the address bit Ai of logic level "1" during the period of the (i+1)-th pulse TW. At the end of the period of the nineth pulse TW, the blowing of the fuse in the spare row selector 66 for the first spare row and the selective blowing of the fuses in the programmable circuits $62_0$ to $62_7$ of the first spare row according to the address of the faulty normal row, have been completed to set up the programming. In the above example, the address of the faulty normal row is of logic level "01010101", so that five fuses including one in the spare row selector are blown out. In this embodiment, these five fuses are blown out not simultaneously but one by one. The fuse-blowing current thus only need be of a magnitude sufficient to ensure reliable blowing of a single fuse, thus being able to use the narrow metal wiring space for current leads and permitting improvement of the reliability of programming without sacrifice in the circuit integration density.

In the above example, the fuses in the programmable circuits $62_1$, $62_3$, $62_5$ and $62_7$ for the first spare row are blown out, so that the output XPi of these circuits is Xi. On the other hand, the output XPi of the programmable circuits $62_0$, $62_2$, $62_4$ and $62_6$, whose fuses are not blown out, is $\overline{Xi}$. Thus, the outputs XP0 to XP7 of the programmable circuits $62_0$ to $62_7$ are all logic level "1" only when the row address of logic level is "01010101", while at least one of them is logic level "0" with any other row address. Since the output SE1 of the spare row selector 66 is "1", it is only when the row address is of logic level "01010101" that the NAND gate 68 generate the output of logic level "0" to disable all the normal rows and select the first spare row 72 instead of the faulty normal row.

When the programming with repsect to one faulty normal row as described above is over, the testing of further memory cells is resumed. When another faulty memory cell is subsequently detected, the same programming operation is repeated. This time, the fuse-blowing voltage VPP is applied not to the terminal VPP1 but to the other terminal VPP2 for the second spare row. If a greater number of faulty memory cells than the number of spare rows are detected, the RAM 34 is rejected. The RAM 34 that has passed the test, that is, with all its detected faulty rows substituted for by spare rows, is transferred to the following fablication stages of dicing and assembly process to obtain a perfect product.

As has been shown with the above embodiment the programming for replacing a normal element (i.e., memory cell row) with a spare element is done using binary data representing the address of the normal element. Thus, it is possible to reduce fuses necessary for the programming. In addition, fuses are blown out one after another, so that all fuses can be reliably blown out even with a current source of a small current capacity and also with narrow metal wiring space for current leads. It is thus possible to realize a redundancy circuit system which is suited for high density integration. Further, the reduction of the number of necessary fuses improves the reliability of the system. In the above embodiment, the address signal was supplied to only a single programmable circuit at a time. However, where the fuse-blowing voltage and the current capacity of the current leads have a sufficient value, it is possible to blow out a plurality of fuses in a plurality of programmable circuits as a set, one set after another. To do so, the output signal of the shift register 48 and the several bits of the latch circuit 42 may be logically multiplied by the AND gate circuit 52 and the several bits of resultant address signal may be supplied to the RAM 34 at the same time. Therefore, a plurality of fuses are blown out as a set.

Figure 8:
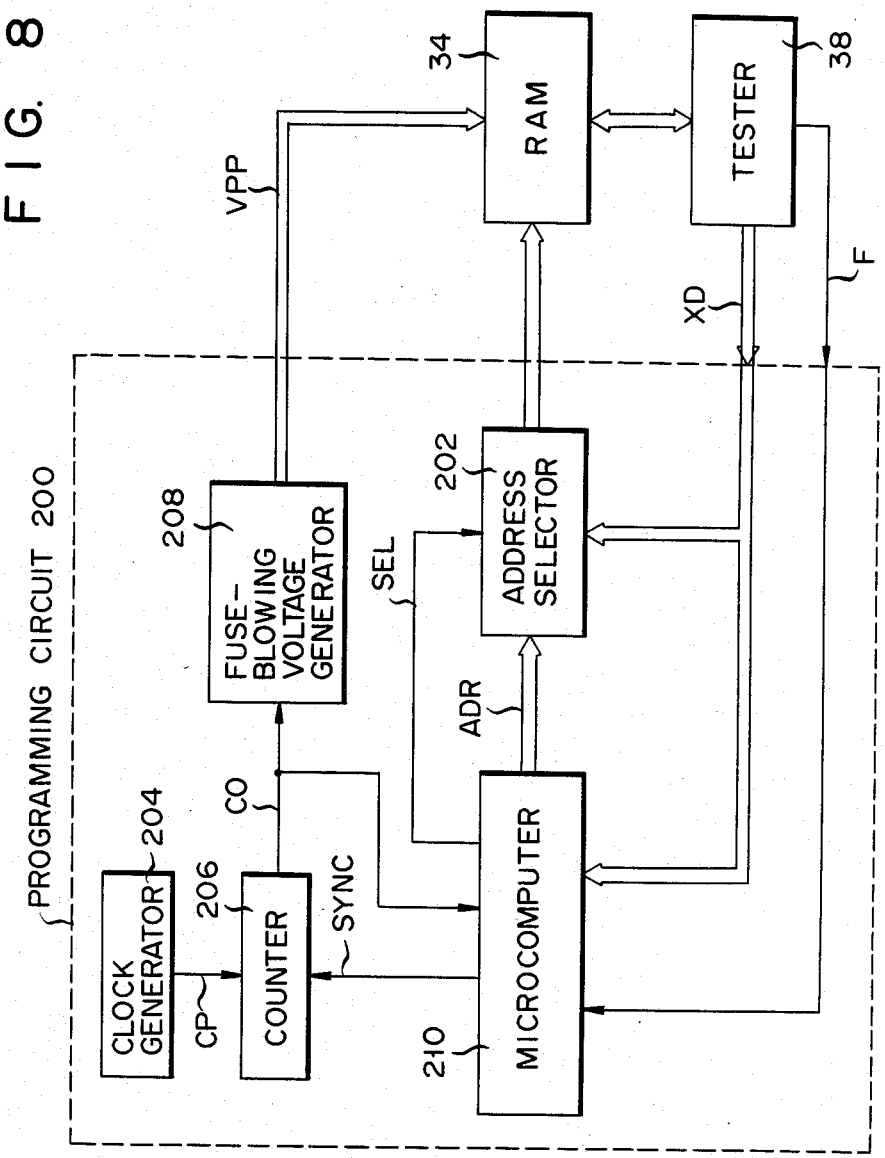
FIG. 8 is a block diagram showing a second embodiment of the apparatus for programming according to the invention.

Now, a second embodiment of the programming apparatus according to the invention will be described. FIG. 8 is a block diagram of the second embodiment. A RAM 34 and a tester 38 have the same construction as the preceding first embodiment. A programming circuit 200, like the first embodiment, comprises an address selector 202, a clock generator 204, a counter 206 and a fuse-blowing voltage generator 208, and it further comprises a microcomputer 210. An address signal XD is supplied from the tester 38 to the address selector 202 and also to the microcomputer 210. The tester 38 supplies a flag signal F to the microcomputer 210. An address signal ADR from the microcomputer 210 is supplied to the address selector 202. The output of the clock generator 204 is supplied to the counter 206. The counter 206 provides a signal of logic level "1" during its operation period. The microcomputer 210 supplies a synchronizing pulse SYNC to the counter 206 in synchronism to the issuance of the address signal ADR. The counter 206 is started to perform a predetermined counting operation in response to the signal SYNC. The output CO of the counter 206 is supplied to the microcomputer 210 and also to a fuse-blowing voltage generator 208.

Figure 9:
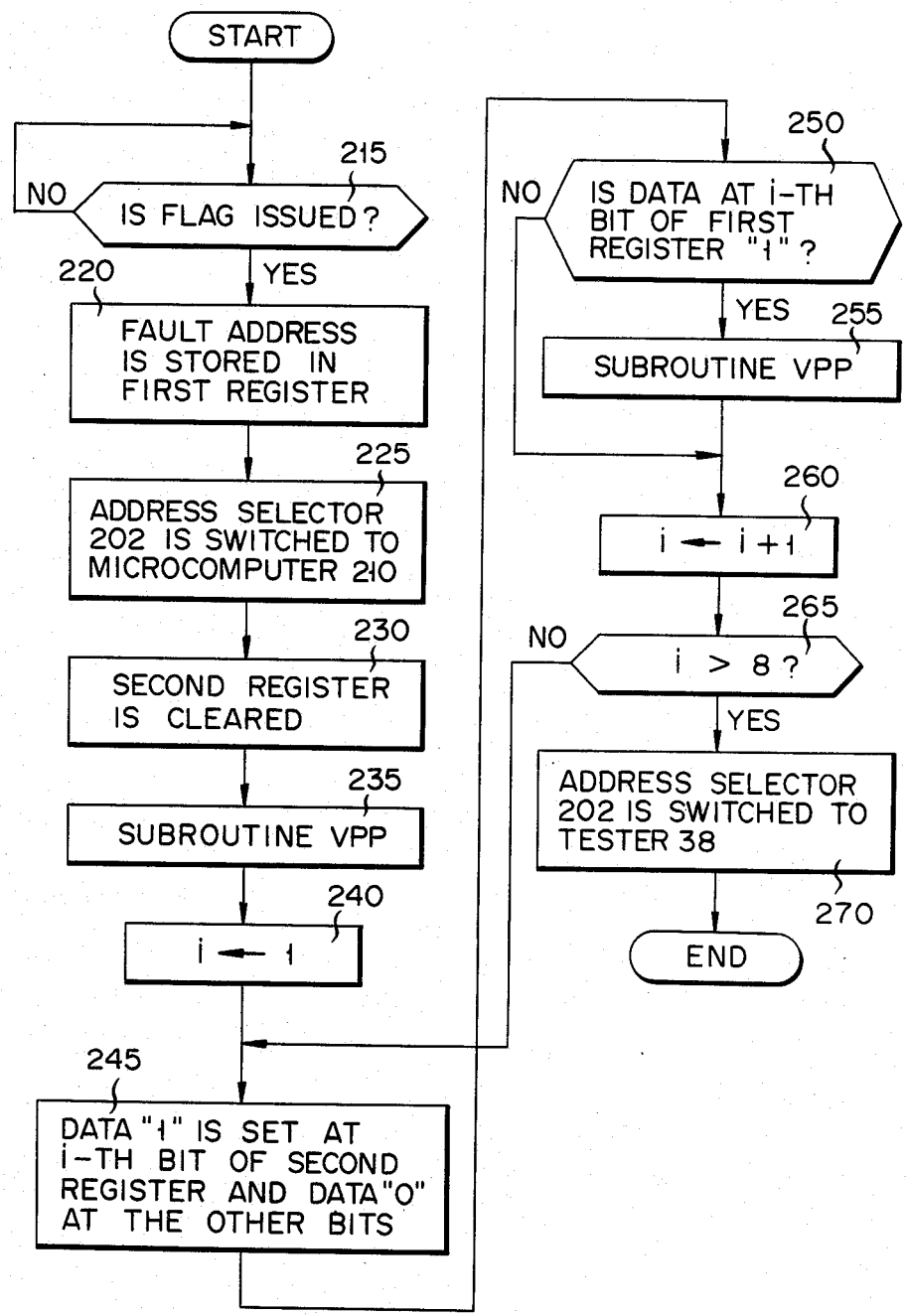
FIGS. 9 and 10 are flow charts for explaining the operation of a microcomputer in the second embodiment.

The programming operation of this embodiment with respect to a faulty memory cell row address, will now be described with reference to the flow charts of the microcomputer 210 shown in FIGS. 9 and 10. Referring now to FIG. 9, when the microcomputer 210 is started, a step 215 takes place, which is a stand-by state to check whether a flag F is issued from the tester 38. When a flag is detected, a step 220 is executed, in which the faulty memory cell row address XD produced from the tester 38 is stored in a first register in the microcomputer 210. In a subsequent step 225, the address selector 202 is switched to the side of the microcomputer 210. In a subsequent step 230, a second register in the microcomputer 210 is cleared. The first and second registers have the same number of bits as the address signal. In a subsequent step 235, a subroutine VPP is called.

Figure 10:
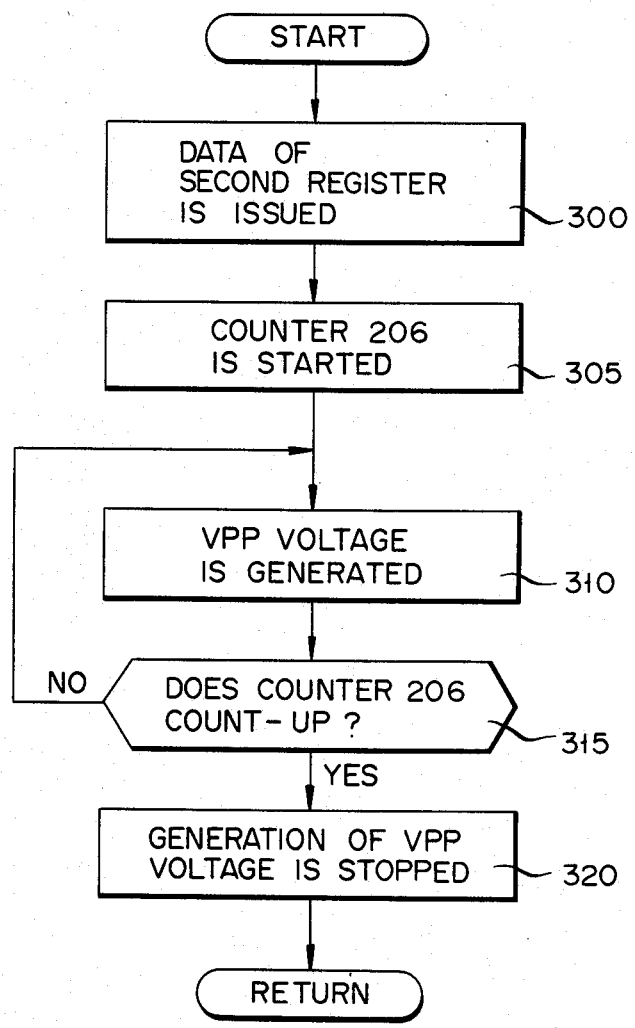

FIG. 10 shows the subroutine VPP in detail. In the subroutine, a step 300 is first executed, in which data in the second register is issued as address ADR. Since the second register has been cleared, all logic level "0" data is supplied as address data to the RAM 34 through the address selector 202. In synchronism to the issue of the address data ADR, the counter 206 is started in a step 305. The counter 206 produces a counter output CO of logic level "1" until it receives a predetermined number of clock pulses. In a subsequent step 310, the fuse-blowing voltage generator 208 supplies a negative large voltage VPP to the RAM 34 according to the counter output of logic level "1". In a subsequent step 315, whether the counter 206 has counted up a predetermined number of clock pulses is checked. When the predetermined number of clock pulses have been counted, the counter 206 is stopped. When the counter 206 is stopped, a step 320 is executed, in which the generation of the fuse-blowing voltage VPP is discontinued, and the program returns to the main routine through a return step. In the operation described so far (i.e., up to the step 235 in the main routine), one faulty memory cell address is stored in the microcomputer 210, and a fuse in the spare row selector for one spare row to be substituted for the faulty normal row is blown out. In a subsequent step 240, parameter i is set to 1. In a subsequent step 245, data of logic level "1" is set for the i-th least significant bit of the second register, and data of logic level "0" for the other bits. In a subsequent step 250, a check is done as to whether the i-th least significant bit data in the first register is of logic level "1". When it is logic level "1", the subroutine VPP is executed as a step 255, and the program then proceeds to a step 260. Otherwise, the step 260 is immediately executed. In the subroutine VPP this time, the data in the second register is different from that in the previous time, that is, it is logic level "1" for only one bit and logic level "0" for the other bits, due to the rotation of the data of logic level "1". In the instant subroutine VPP, therefore, only the fuse of one of the programmable circuits for one spare memory cell row is blown out. In the step 260, the parameter i is incremented by 1. In a subsequent step 265, a check is done as to whether the parameter i is greater than 9 or not, i.e., whether all bits of the address signal has been issued or not. When the parameter i is not greater than 8, the routine goes back to the step 245. At this time, the parameter i has been incremented by 1. When the parameter i is greater than 8, the programming routine is over, and a step 270 is executed, in which the address selector 202 is switched to the side of the tester 38. Whereby the test routine is started again. With the switching of the address selector 202, the microcomputer 210 is returned to the stand-by state step 215.

Figure 11:
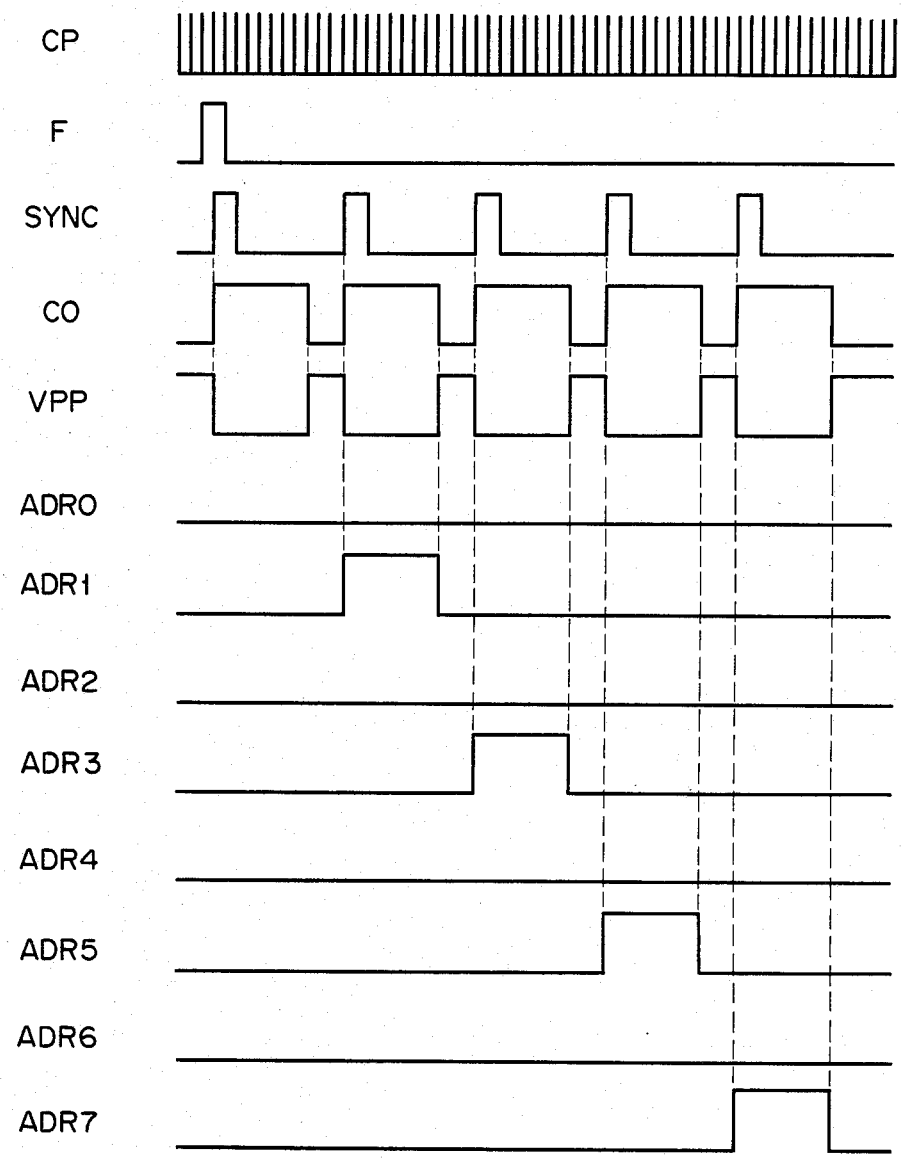
FIG. 11 is a timing chart for explaining the operation of the second embodiment.

The timing chart of FIG. 11 illustrates signals involved in the operation of the programming circuit of FIG. 8. It is again assumed that the detected faulty memory cell address is "01010101". When a flag F is issued as a result of detection of the faulty memory cell, the address "01010101" is stored in the first register of the microcomputer 210. At the same time, a select signal SEL for switching the address selector 202 to the side of the microcomputer 210 is generated. Data of all logic level "0" are set in the second register of the microcomputer 210. The microcomputer 210 first issues the data in the second register as address data AD0 to AD7 supplied through the address selector 202 to the respective address buffers in the RAM 34. The microcomputer 210 also supplies a synchronizing signal SYNC to the counter 206 in synchronism to the issue of the address signal ADR. With the synchronizing signal SYNC supplied to it, the counter 206 is started for counting clock pules CP. At this time, the output CO of the counter 206 goes to logic level "1". When the counter 206 completes the counting of a predetermined number of clock pulses CP, the output CO goes to logic level "0". While the counter output CO is at logic level "1", a negative fuse-blowing voltage pulse VPP is issued and applied to the terminal VPP1 of the RAM 34. Since the address data A0 to A7 are all logic level "0" at this time, the fuse in the spare row selector 66 is blown out.

Figure 12A:
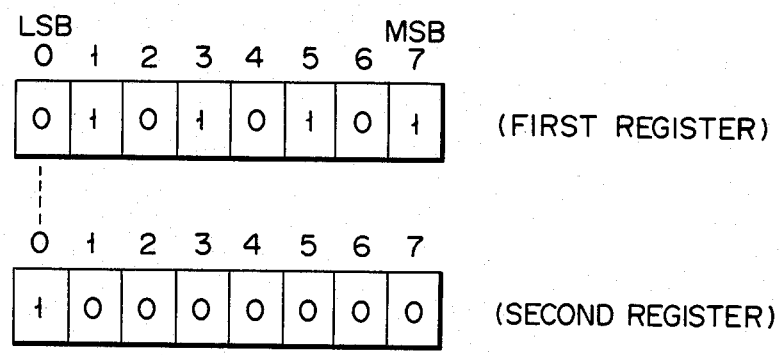
FIGS. 12A and 12B are data charts of a faulty address for explaining the operation of the second embodiment.
Figure 12B:
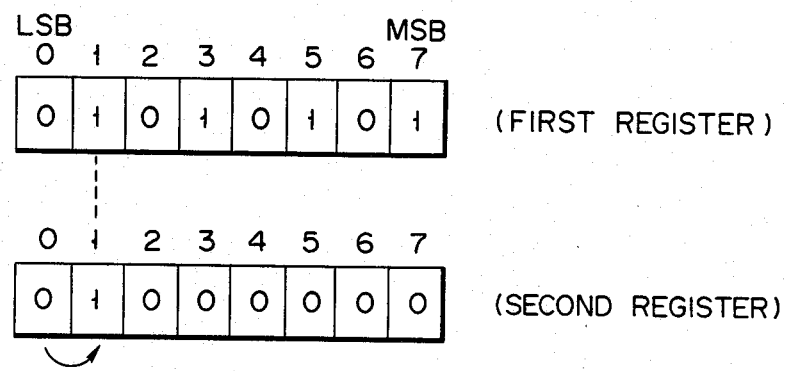

Then, data of logic level "1" is set in the least significant bit and data of logic level "0" in the other bits of the second register of the microcomputer 210, as shown in FIG. 12A. The data in the first register is of logic level "1" in the first, third, fifth and most significant bits and of logic level "0" in the other bits. Thus, with data of logic level "1" in the least significant bit in the second resister, no address signal is produced, and the data ADR0 to ADR7 remain all logic level "0". When the data of logic level "1" is shifted by one bit in the second register so that the data in the first bit is of logic level "1", as shown in FIG. 12B, the data of logic level "01000000" in the second register is produced as data ADR since the data in the first bit in the first register is of logic level "1". In synchronism to the issue of this data, a pulse VPP is generated, so that the fuse in only the programmable circuit $62_1$ corresponding to the first bit among the programmable circuits $62_0$ to $62_7$ for the first spare row, it blown out. While the data of logic level "1" is subsequently shifted in the second register, the data of the second register is issued only when the bit of the first register corresponding to the "1" bit of the second register is "1".

As has been shown, again with this embodiment only a single fuse is blown out at a time, since the address signal issued from the microcomputer 210 and supplied to the RAM 34 is of logic level "1" only for one bit and of logic level "0" for the other bits. Thus, reliable blowing of fuse can be ensured with a small fuse-blowing current. Further this embodiment has the following advantage over the previous first embodiment. In the first embodiment, the address signal fed to the individual bit programmable circuits of the RAM is successively shifted according to the shift register output signal, so that the pulse VPP and address signal are supplied to the programmable circuits with the fuses thereof not to be blown out as well. Therefore, corresponding waste time is involved in the period of programming. In the second embodiment, only address signals, which have data of logic level "1" only in bits corresponding to "1" bits of a faulty row address, are supplied together with the pulse VPP to the RAM 34. Thus, there is not waste time, i.e., any time during which the pulse VPP and address signal of all logic level "0" are produced in case when no fuse is to be blown out is not involved in this programming. The programming time thus can be reduced. The scheme of the second embodiment again permits blowing a plurality of fuses at a time by setting the second register data to logic level "1" for the corresponding bits and causing the shifting of the set data "1" one by one.

As has been described in the foregoing, according to the invention there is provided a method of programming for a programmable circuit in a redundancy circuit system, which can ensure reliable blowing of fuses with a small fuse-blowing current. While the foregoing description has concerned with RAMs as the redundancy circuit system, this is by no means limitative, and the invention is generally applicable to any semiconductor integrated circuit, in particular a semiconductor memory.

What is claimed is:

1. A redundancy memory device comprising:
   normal memory cells;
   a spare memory cell;
   address buffer means for receiving and storing an address signal;
   a normal memory decoder, connected between the address buffer means and the normal memory cells, for enabling the normal memory cell which is specified by the address signal stored in the address buffer means;
   programmable means, connected to the address buffer means and having fuse elements whose number is equal to the number of bits of said address signal, for storing an address of a faulty normal memory cell in the combination of blown-out and non-blown-out fuse elements of said fuse elements, and for producing a detection signal when the address signal specifying the faulty normal memory cell is supplied;
   fuse blowing means for sequentially blowing at least one of said fuses at a time by supplying a fuse blowing signal to said fuses, said fuse blowing signal being produced according to the address signal specifying the faulty normal memory cell wherein said fuse blowing means comprises a shift register, having output terminals whose number is equal to the number of bits of said address signal, for sequentially outputting output signals from the respective bits of output terminals in succession, a latch for latching said address signal specifying the faulty address signal, and AND gates, which are respectively connected to said fuse elements, for logically multiplying the output of each bit from the shift register and latch circuit;
   an additional spare cell;
   spare row selectors each of which is provided for each of the spare memory cells and each of which has a fuse element, the fuse element being blown out when the corresponding spare memory cell is used as the faulty normal memory cell, and the spare row selectors producing the selection signal when the fuse element is blown out;
   decoder controller means, connected to the programmable means, the spare row selectors, the normal memory decoder, and the spare memory cell, for disabling the normal memory decoder and enabling the spare memory cell in response to the detection signal produced from said programmable means and the selection signal produced from said spare row selectors.

2. A redundancy memory device according to claim 1, in which said fuse blowing means supplies the fuse blowing signal successively to said fuse elements so that they are blown out one at a time.

3. A redundancy memory device comprising:

normal memory cells;

a spare memory cell;

address buffer means for receiving and storing an address signal;

a normal memory decoder, connected between the address buffer means and the normal memory cells, for enabling the normal memory cell which is specified by the address signal stored in the address buffer means;

programmable means, connected to the address buffer means and having fuse elements whose number is equal to the number of bits of said address signal, for storing an address of a faulty normal memory cell and the combination of blown-out and non-blown-out fuse elements of said fuse elements, and for producing a detection signal when the address signal specifying the faulty normal memory cell is supplied;

fuse blowing means for sequentially blowing at least one of said fuses at a time by supplying a fuse blowing signal to said fuses, said fuse blowing signal being produced according to the address signal specifying the faculty normal memory cell wherein said fuse blowing means comprises a first register for storing said address signal specifying the faulty address signal, a second register having the same nunber of bits as that of said first register, data setting means for sequentially and successively setting data "1" at the respective bits of said second register, comparing means for sequentially comparing the data of said first and second registers to detect the coincidence therebetween, and means for supplying the fuse blowing signal to said fuse elements corresponding to the bit at which data "1" is set, when the coincidence is detected by said comparing means;

an additional spare cell;

spare row selectors each of which is provided for each of the spare memory cells and each of which has a fuse element, the fuse element being blown out when the corresponding spare memory cell is used as the faulty normal memory cell, and the spare row selectors producing the selection signal when the fuse element is blown out;

decoder control means, connected to the programmable means, the normal memory decoder, and the spare memory cell, for disabling the normal memory decoder and enabling the spare memory cell in response to the detection signal produced from said programmable means and the selection signal produced from said spare row selectors.

4. A redundancy memory device according to claim 3, in which said fuse blowing means supplies the fuse blowing signal successively to said fuse elements so that they are blown out one at a time.

* * * * *